United States Patent
Kuroda et al.

(10) Patent No.: US 7,355,272 B2
(45) Date of Patent: Apr. 8, 2008

(54) SEMICONDUCTOR DEVICE WITH STACKED SEMICONDUCTOR CHIPS OF THE SAME TYPE

(75) Inventors: Hiroshi Kuroda, Akishima (JP); Noriaki Sakamoto, Kodaira (JP); Takafumi Kikuchi, Higashiyamato (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/049,993

(22) Filed: Feb. 4, 2005

(65) Prior Publication Data

US 2005/0230801 A1 Oct. 20, 2005

(30) Foreign Application Priority Data

Mar. 30, 2004 (JP) ............... 2004-098440

(51) Int. Cl.
*H01L 23/48* (2006.01)
*H01L 23/495* (2006.01)
*H01L 23/12* (2006.01)
*H01L 25/065* (2006.01)
*H01L 25/07* (2006.01)

(52) U.S. Cl. ............... 257/686; 257/E23.069; 257/E23.175; 257/325.013; 257/E25.011; 257/777; 257/738; 257/737; 257/724; 257/728; 257/723; 257/784; 257/786

(58) Field of Classification Search ........ 257/E23.069, 257/E23.175, E25.013, E25.011, 686, 777, 257/723, 724, 728, 685, 784, 786, 737, 738, 257/734
See application file for complete search history.

(56) References Cited

U.S. PATENT DOCUMENTS

| | | | |
|---|---|---|---|
| 6,229,217 B1 * | 5/2001 | Fukui et al. ................ | 257/777 |
| 6,617,694 B2 * | 9/2003 | Kodaira et al. ............. | 257/777 |
| 6,664,644 B2 * | 12/2003 | Morozumi ................... | 257/777 |
| 6,919,631 B1 * | 7/2005 | Hoffman et al. ............ | 257/707 |
| 7,009,303 B2 * | 3/2006 | Kuroda et al. .............. | 257/777 |
| 7,042,073 B2 * | 5/2006 | Kado et al. ................. | 257/678 |
| 7,078,818 B2 * | 7/2006 | Fujimoto et al. ........... | 257/777 |
| 2002/0151103 A1 * | 10/2002 | Nakamura et al. ......... | 438/106 |
| 2004/0124539 A1 * | 7/2004 | Yang et al. ................. | 257/777 |
| 2004/0184250 A1 * | 9/2004 | Wang ......................... | 361/790 |
| 2005/0104183 A1 * | 5/2005 | Kuroda et al. ............. | 257/686 |
| 2005/0140023 A1 * | 6/2005 | Kinoshita et al. .......... | 257/778 |
| 2005/0173807 A1 * | 8/2005 | Zhu et al. ................... | 257/777 |

FOREIGN PATENT DOCUMENTS

| | | |
|---|---|---|
| JP | 05-121643 | 5/1993 |
| WO | WO 02/103793 | 12/2002 |

\* cited by examiner

*Primary Examiner*—Alexander Oscar Williams
(74) *Attorney, Agent, or Firm*—Miles & Stockbridge P.C.

(57) ABSTRACT

A semiconductor device includes a wiring board, a first semiconductor chip (e.g. DRAM) that is flip-chip connected on the wiring board, a second semiconductor chip (e.g. DRAM) that is of the same type as the first semiconductor chip and is mounted face up on the first semiconductor chip such that the orientation of the arrangement of the pads is at 90° from that of the first semiconductor chip, a third semiconductor chip (e.g. microcomputer chip) disposed on the second semiconductor chip, wires, and a sealing medium. The wiring board has a plurality of common wiring patterns for electrically connecting first electrodes for the first semiconductor chip and second electrodes for the second semiconductor chip. The common wiring patterns can be disposed without crossing on the surface wire layer of the wiring board.

12 Claims, 16 Drawing Sheets

SEMICONDUCTOR DEVICE WITH STACKED SEMICONDUCTOR CHIPS OF THE SAME TYPE

BACKGROUND OF THE INVENTION

1. Field of the Invention

The present invention relates to a semiconductor device, and in particular, relates to a technique effective in application to a semiconductor device including a plurality of semiconductor chips.

2. Description of the Related Art

In conventional semiconductor devices (multichip modules) having multiple semiconductor chips, of three chips mounted on the main surface of the package board, a chip having a dynamic random access memory (DRAM) and a chip having a flash memory are each electrically connected to the wire of the package board via an Au bump. On the two chips, a chip having a high speed microprocessor is mounted and electrically connected to a bonding pad of the package board via an Au wire (e.g., refer to Patent Document 1: IP No. WO 02/103793, Ver. A1 (FIG. 2)).

Conventional memory modules including multiple semiconductor memory chips on the interconnection board include two or more layered chips such that the outputconnection of one chip intersects another chip directly thereunder so as to cross it. (e.g., refer to Patent Document 2: JP-A-5-121643 (FIG. 1)).

It is known in the art to provide a semiconductor device called a system-in-package (SIP) in which a semiconductor chip (hereinafter, referred to as a microcomputer chip) having an arithmetic processing function and a semiconductor chip having a memory circuit (hereinafter, referred to as a memory chip) are mounted on a wiring board.

The need for mass-storage memory of semiconductor devices has arisen as the users' demand for processing a high volume of data grows, and in addition, miniaturization of semiconductor devices is required to mount the semiconductor devices on compact electronic equipment.

Realizing high capacity of the memory with one chip increases the chip size, posing the problem of increasing the wiring board too, thus hindering the miniaturization of the semiconductor devices.

Accordingly, the present inventor studied a stack structure of memories of the same type to achieve the mass storage of memories and the miniaturization of semiconductor devices.

Patent Document 2 describes the stack structure of memory chips on a wiring board but does not describe the wiring layout of the wiring board at all.

SUMMARY OF THE INVENTION

Accordingly it is an object of the present invention to provide a semiconductor device capable of achieving mass storage of a memory and miniaturization of a device body.

It is another object of the invention to provide a semiconductor device capable of high-speed processing while achieving mass storage of the memory.

It is still another object of the invention to provide a semiconductor device capable of facilitating the wiring layout of the wiring board.

The above and other objects, features and advantages of the present invention will be apparent from the following detailed description of the preferred embodiments of the invention in conjunction with the accompanying drawings.

The present invention will be briefly described hereinbelow.

A semiconductor device according to the invention includes a wiring board having a main surface and a back surface opposite thereto; a first semiconductor chip including a semiconductor device and a plurality of electrodes on a main surface thereof, the main surface being disposed to face the main surface of the wiring board and electrically connected to the wiring board by flip-chip connection; a second semiconductor chip of the same type as the first semiconductor chip, the second semiconductor chip including a semiconductor device and a plurality of electrodes on a main surface thereof, mounted on the first semiconductor chip with the main surface up, and electrically connected to the wiring board with a conductive wire; and a plurality of external terminals disposed on the back surface of the wiring board. The wiring board has a plurality of common wires for electrically connecting a plurality of first electrodes of the electrodes of the first semiconductor chip and a plurality of second electrodes of the second semiconductor chip corresponding to the first electrodes with one another. The first semiconductor chip has a first side along the row of the first electrodes and a second side. The second semiconductor chip is mounted on the first semiconductor chip in such a manner that the second electrodes are arranged along the second side of the first semiconductor chip.

A semiconductor device according to the invention includes a wiring board having a main surface and a back surface opposite thereto; a first semiconductor chip including a semiconductor device and a plurality of electrodes on a main surface thereof and electrically connected to the wiring board; a second semiconductor chip of the same type as the first semiconductor chip, the second semiconductor chip including a semiconductor device and a plurality of electrodes on a main surface thereof, mounted on the first semiconductor chip with the main surface up, and electrically connected to the wiring board with a conductive wire; and a plurality of external terminals disposed on the back surface of the wiring board. The wiring board has a plurality of first independent wires connected to a plurality of third electrodes of the electrodes of the first semiconductor chip and electrically connected to the corresponding external terminals and a plurality of second independent wires connected to a plurality of fourth electrodes of the electrodes of the second semiconductor chip and electrically connected to the corresponding external terminals. The first semiconductor chip has a first side along the row of the third electrodes and a second side. The second semiconductor chip is mounted on the first semiconductor chip in such a manner that the fourth electrodes are arranged along the second side of the first semiconductor chip.

A semiconductor device according to the invention includes a wiring board having a main surface and a back surface opposite thereto; a first semiconductor chip including a semiconductor device and a plurality of electrodes on a main surface thereof, the main surface being disposed to face the main surface of the wiring board and electrically connected to the wiring board by flip-chip connection; a second semiconductor chip of the same type as the first semiconductor chip, the second semiconductor chip including a semiconductor device and a plurality of electrodes on a main surface thereof, mounted on the first semiconductor chip with the main surface up, and electrically connected to the wiring board with a conductive wire; and a plurality of external terminals disposed on the back surface of the wiring board. The wiring board has a plurality of common wires for electrically connecting a plurality of first electrodes of the electrodes of the first semiconductor chip and a plurality of second electrodes of the second semiconductor chip corresponding to the first electrodes with one another, a plurality of first independent wires connected to a plurality of third electrodes of the electrodes of the first semiconductor chip and electrically connected to the corresponding external terminals, and a plurality of second independent wires connected to a plurality of fourth electrodes of the electrodes of the second semiconductor chip and electrically connected to the corresponding external terminals. The first semiconductor chip has a first side along the row of the first electrodes and a second side. The second semiconductor chip is mounted on the first semiconductor chip in such a manner that the second electrodes are arranged along the second side of the first semiconductor chip.

The advantages of the invention will be briefly described as follows:

The semiconductor device according to an embodiment of the invention includes a wiring board, a first semiconductor chip mounted on the wiring board by flip-chip connection, and a second semiconductor chip that is of the same type as the first semiconductor chip and mounted face up on the first semiconductor chip. The wiring board includes a plurality of common wires for electrically connecting a plurality of first electrodes of the first semiconductor chip and a plurality of second electrodes of the second semiconductor chip corresponding to the first electrodes with one another. The first semiconductor chip has a first side along the row of the first electrodes and the other sides. The second semiconductor chip is mounted on the first semiconductor chip such that the second electrodes are arranged along the other sides of the first semiconductor chip, so that the second semiconductor chip of the same type as the first semiconductor chip is placed on the first semiconductor chip in different orientation. Accordingly the common wires can be routed without crossing on the wiring board. Consequently, the common wires can be routed without increasing the number of the wire layers of the wiring board, thus allowing low profile of the wiring board and cost reduction. Since the second semiconductor chip of the same type as the first semiconductor chip is placed on the first semiconductor chip in different orientation, electrodes for flip-chip connection and electrodes for wire connection can be dispersed on different regions on the wiring board, thus achieving efficient arrangement of the electrodes on the wiring board. Therefore, the wiring board can be made more compact. When both of the chips have a memory circuit, both of mass storage of the memory and miniaturization of the semiconductor device can be achieved.

DESCRIPTION OF THE PREFERRED EMBODIMENTS

Figure 1:
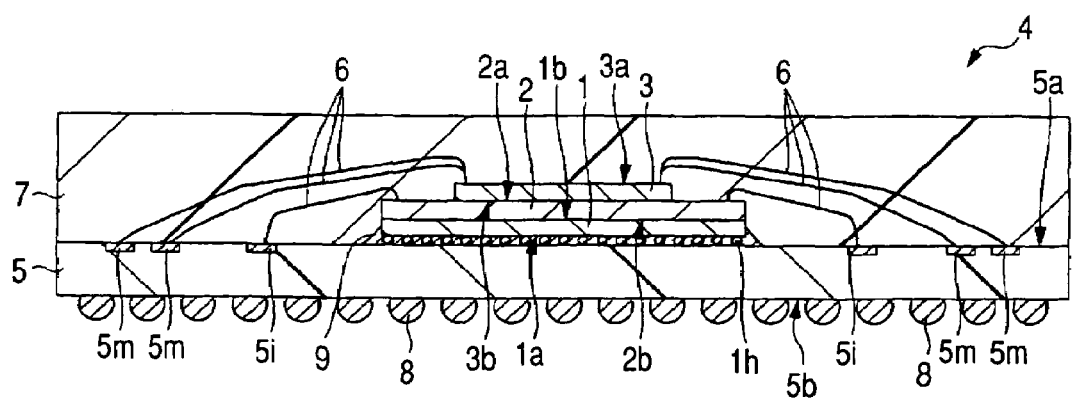
FIG. 1 is a cross sectional view of an example of the structure of a semiconductor device according to an embodiment of the present invention.

Description of the same or similar components will not be repeated in the following embodiments in principle unless particularly required.

The following embodiments will be divided into multiple sections or embodiments for convenience if necessary. However, they are not irrelevant to one another unless otherwise noted; one is a modification, a detailed description, or a supplementary description of part or all of the other embodiments.

The numerals (including the number, value, amount, and range) of the components of the following embodiments are not limited to specific numerals unless otherwise noted and limited to the specific numerals in principle, but may be the specific numerals or more or less.

The embodiments of the invention will be specifically described hereinbelow with reference to the drawings. Components having the same functions are given the same reference numerals in the drawings for describing the embodiments and their repetition will be omitted.

Figure 2:
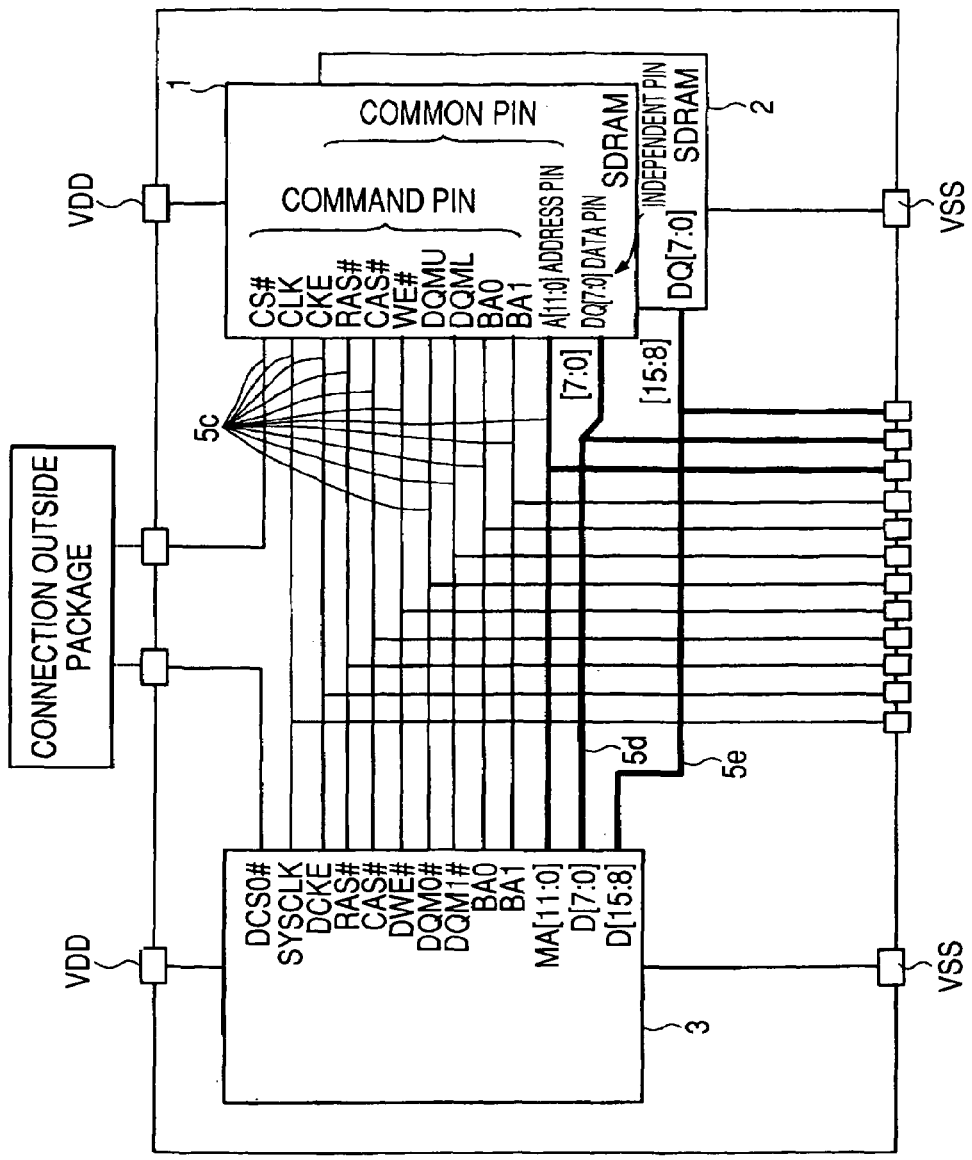
FIG. 2 is a block diagram of an example of the semiconductor device of FIG. 1.
Figure 3:
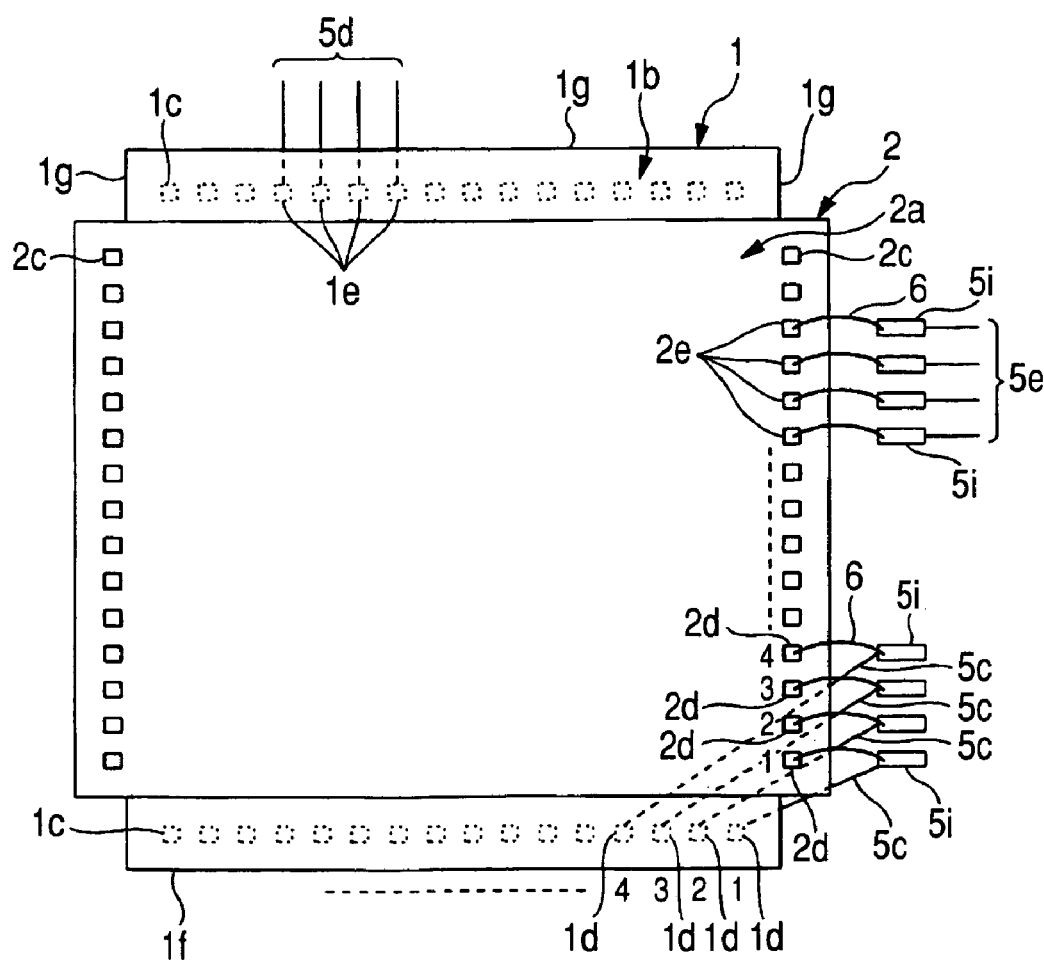
FIG. 3 is a plan view of an example of the mounting direction of a first semiconductor chip and a second semiconductor chip mounted on the semiconductor device of FIG. 1.
Figure 4:
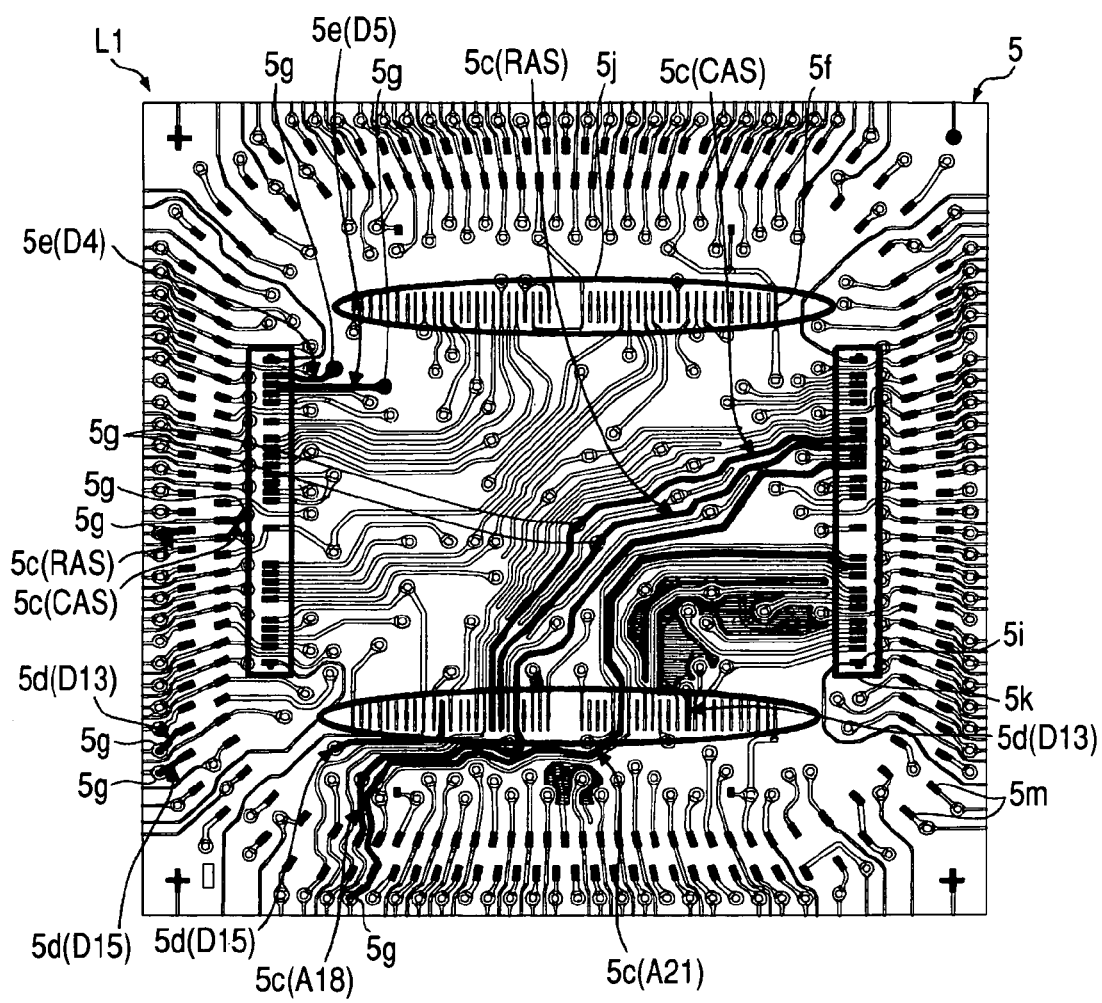
FIG. 4 is a plan view of an example of a wiring pattern of the uppermost wire layer (L1) of a wiring board incorporated into the semiconductor device of FIG. 1.
Figure 5:
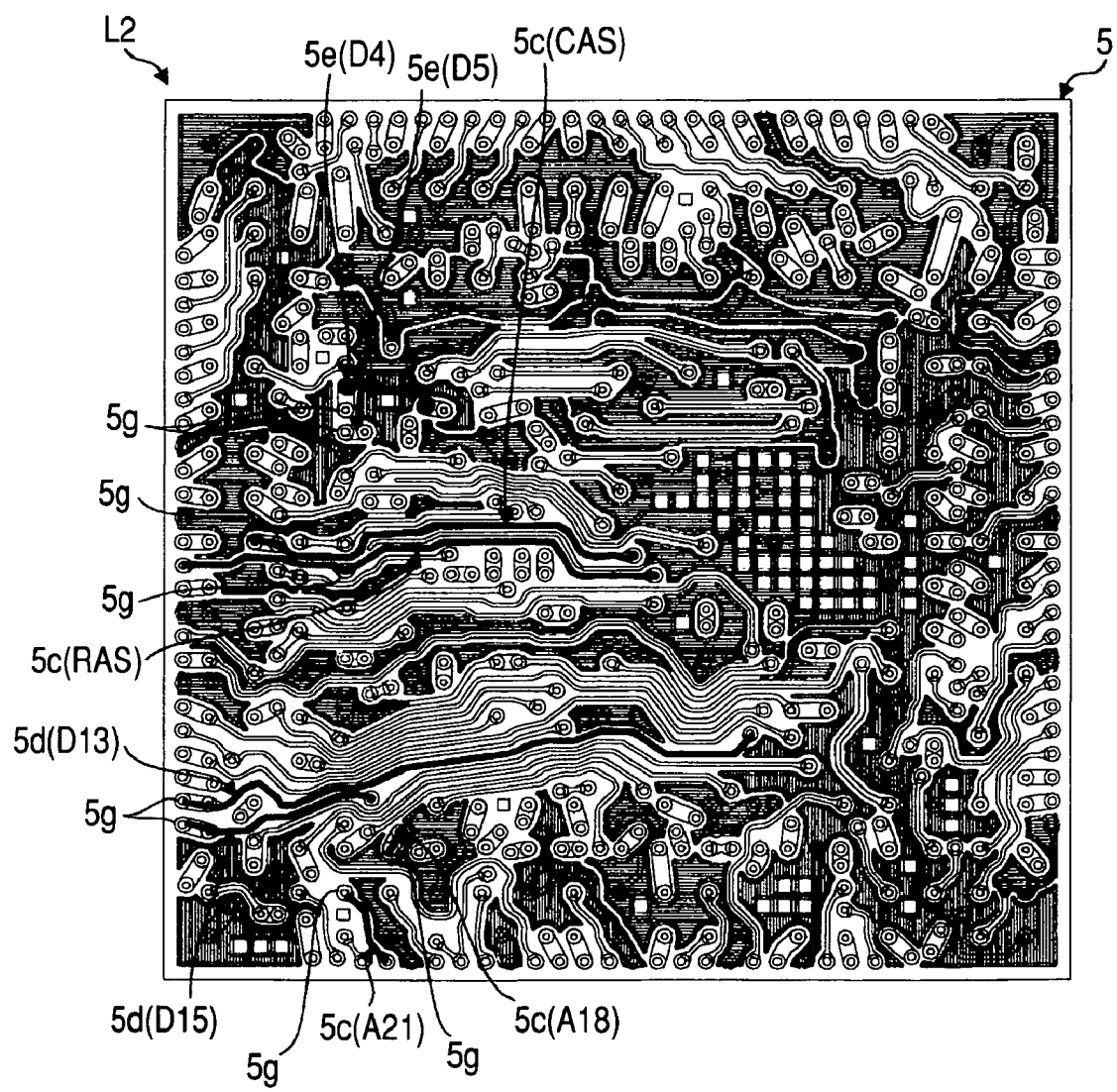
FIG. 5 is a plan view of an example of the wiring pattern of the second wire layer (L2) from the top of the wiring board incorporated into the semiconductor device of FIG. 1.
Figure 6:
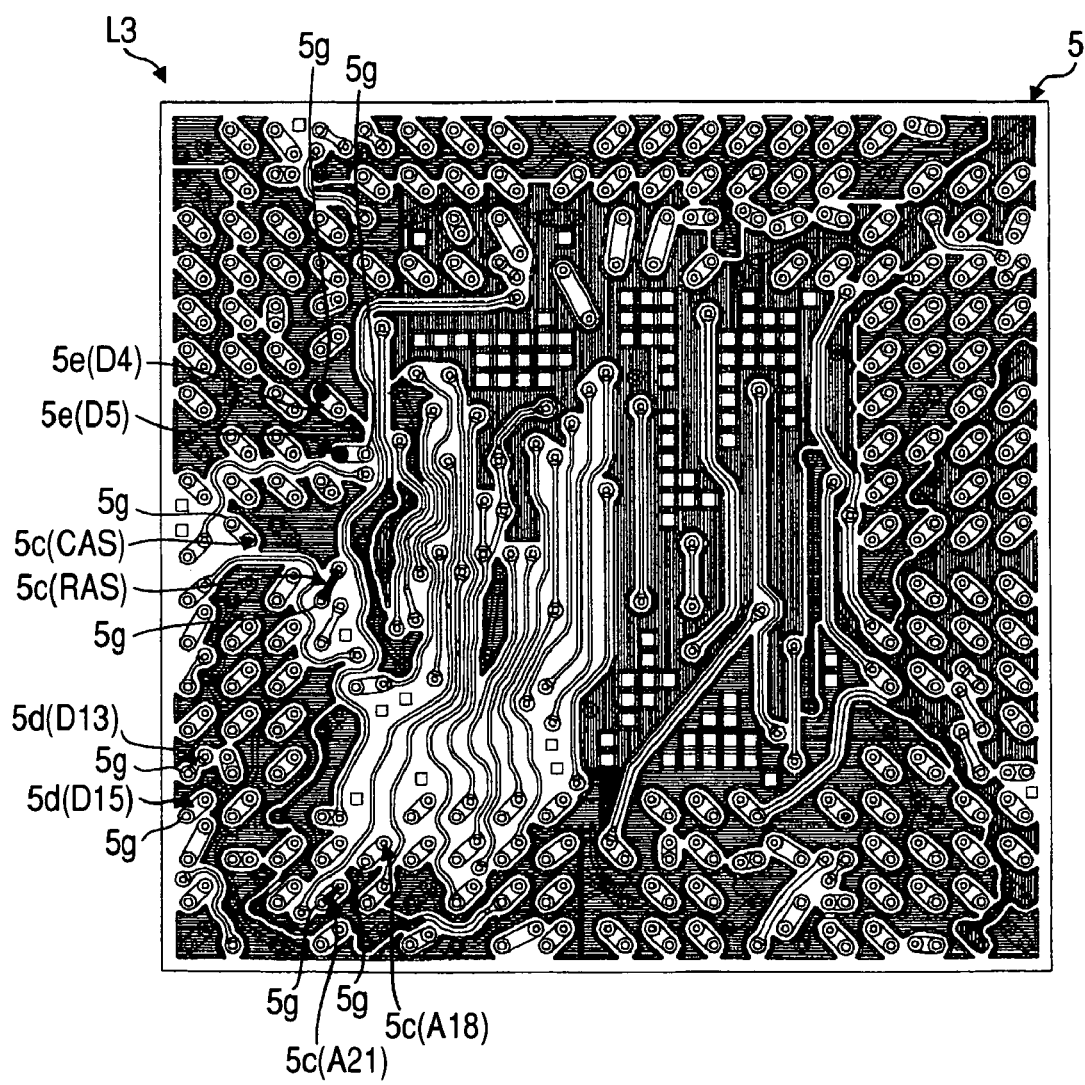
FIG. 6 is a plan view of an example of the wiring pattern of the third wire layer (L3) from the top of the wiring board incorporated into the semiconductor device of FIG. 1.
Figure 7:
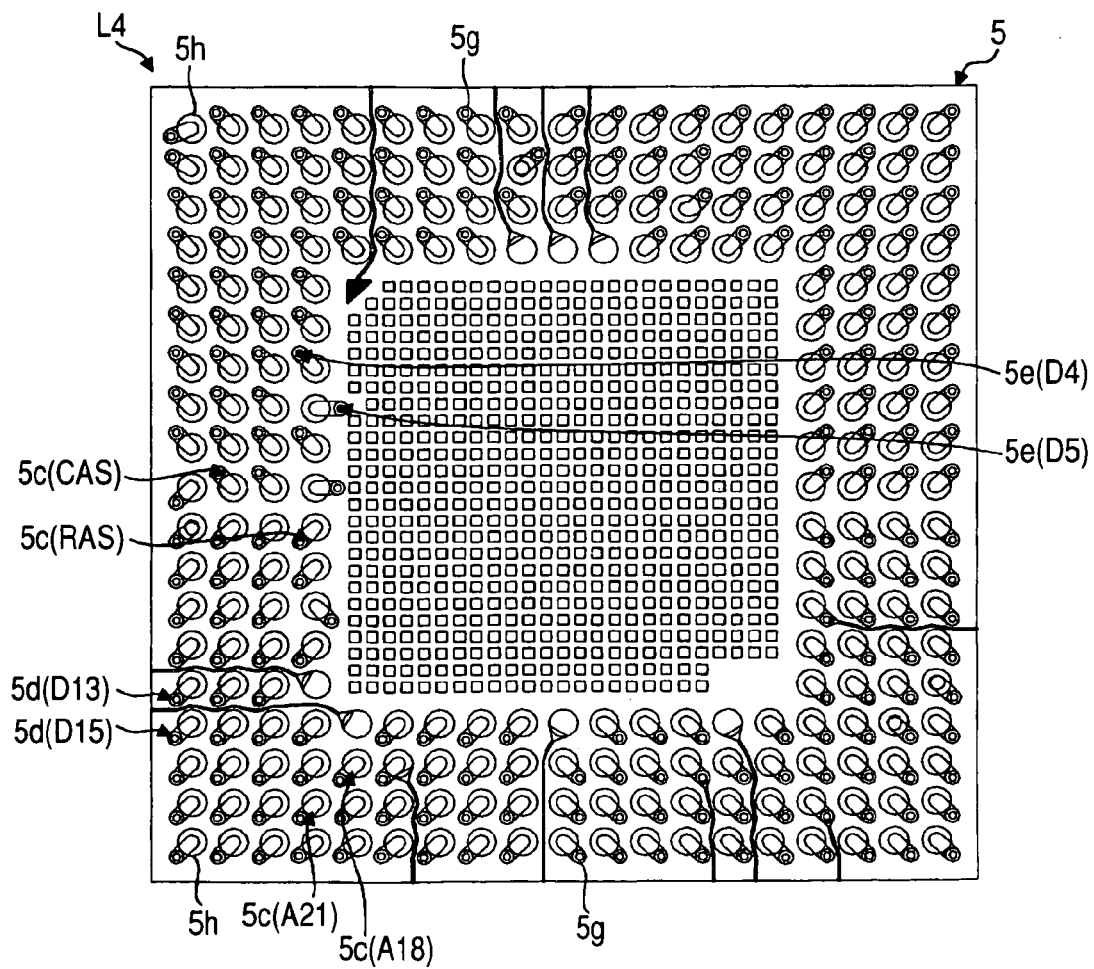
FIG. 7 is a plan view of an example of the wiring pattern of the fourth wire layer (L4) from the top of the wiring board incorporated into the semiconductor device of FIG. 1.
Figure 8:
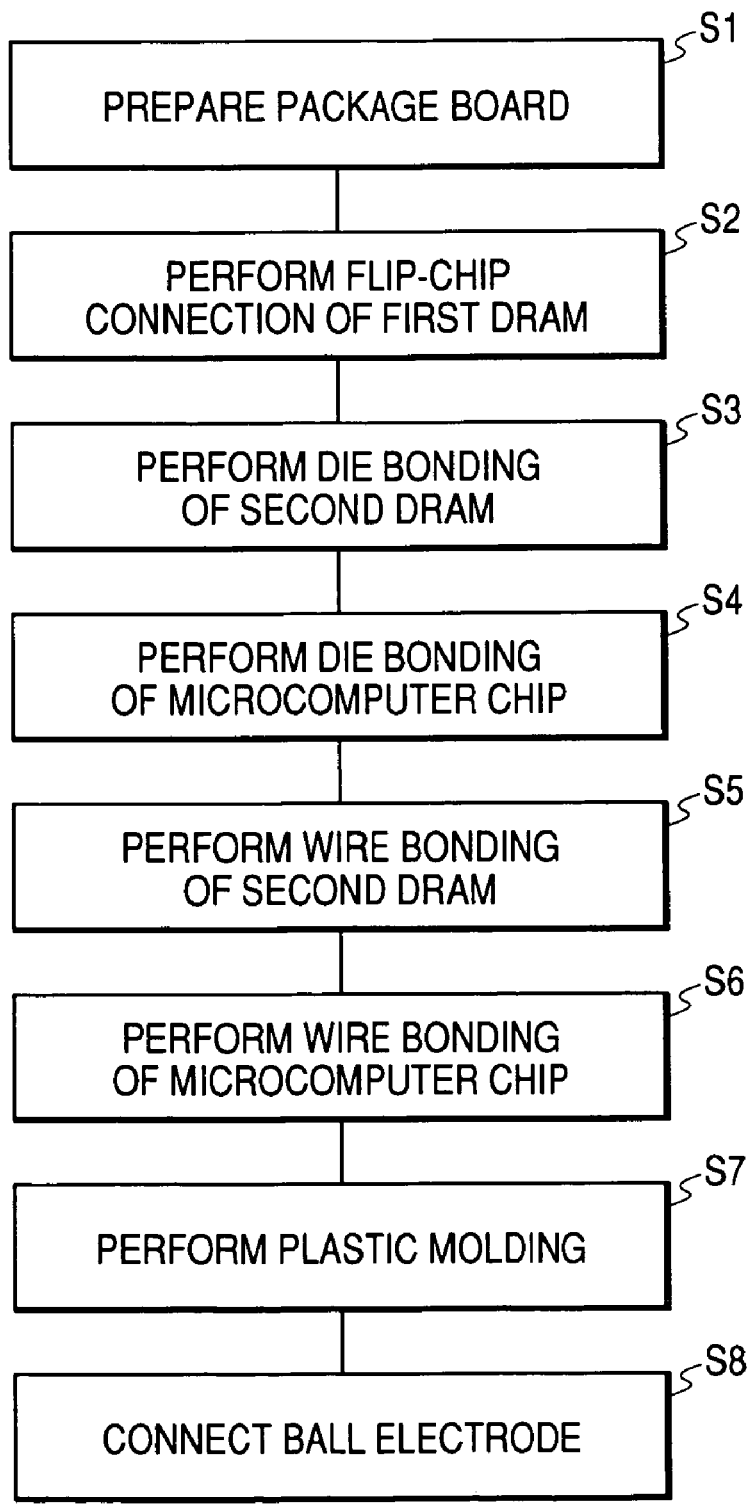
FIG. 8 is a manufacturing flowchart of an example of the assembly procedure of the semiconductor device of FIG. 1.
Figure 9:
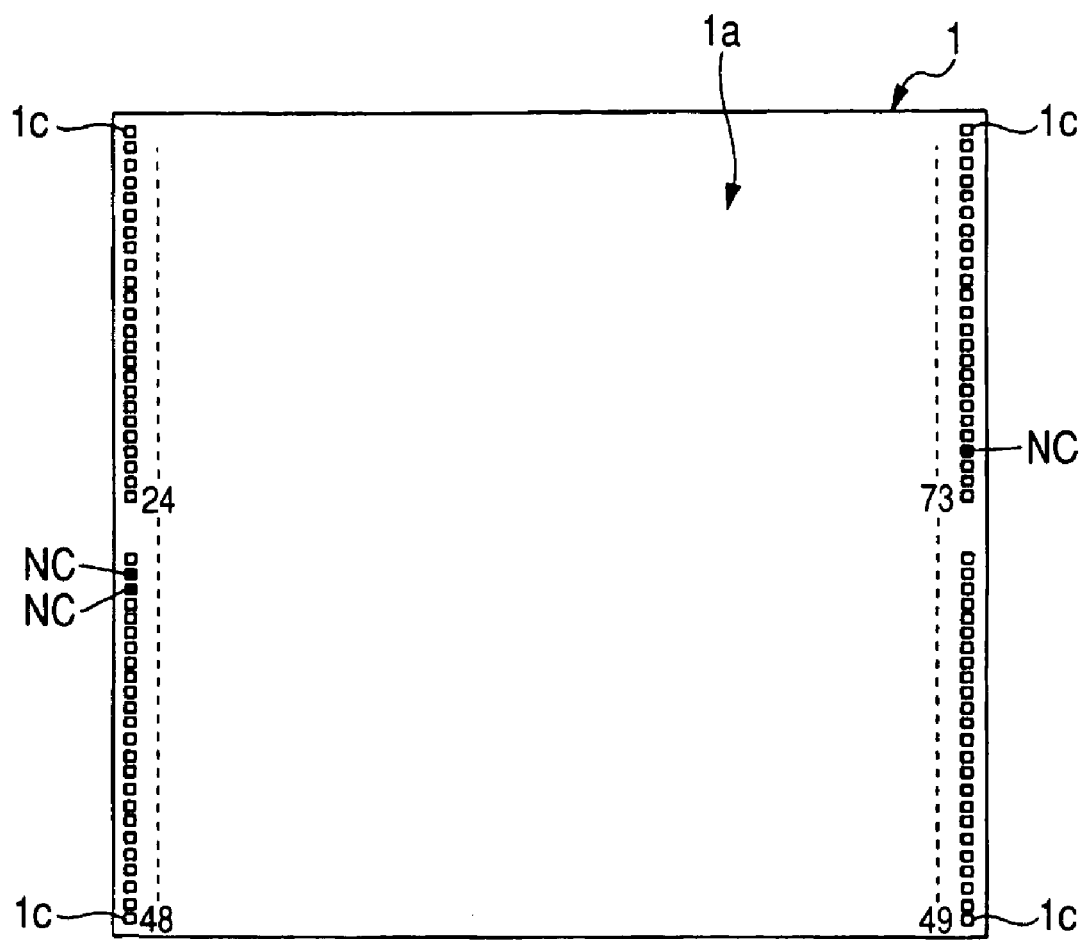
FIG. 9 is a plan view of an example of the structure of the first semiconductor chip mounted on the semiconductor device of FIG. 1.
Figure 10:
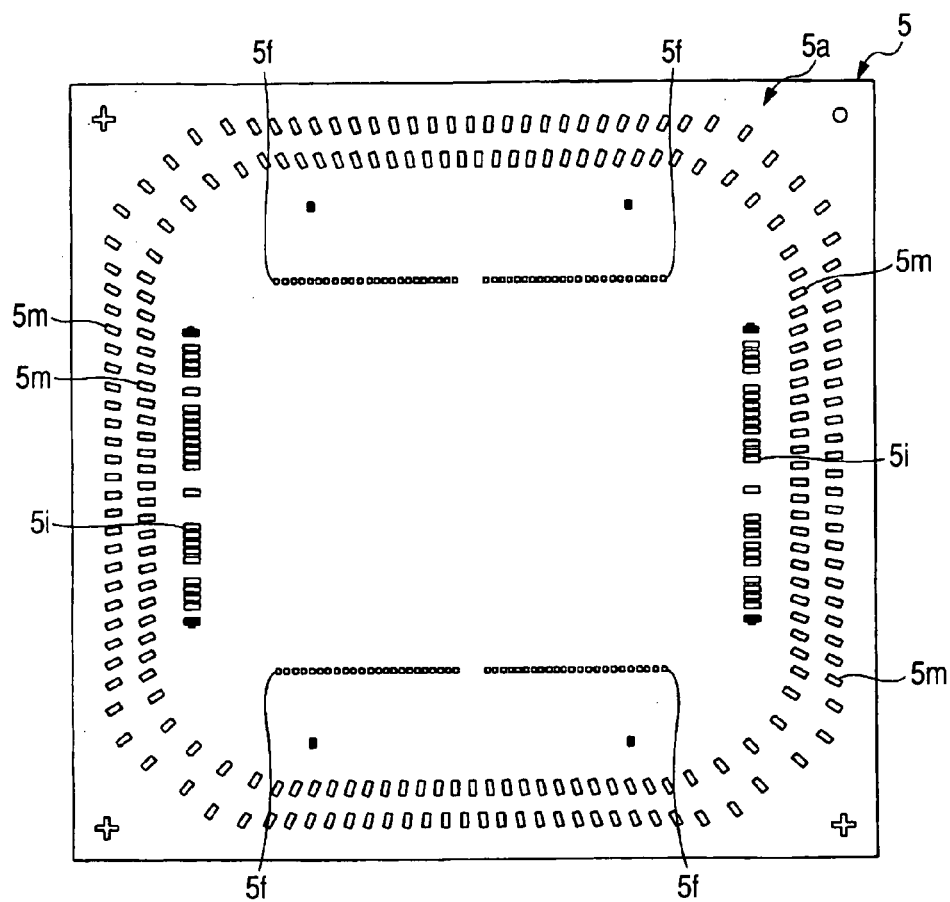
FIG. 10 is a plan view of an example of the structure of a wiring board incorporated into the semiconductor device of FIG. 1.
Figure 11:
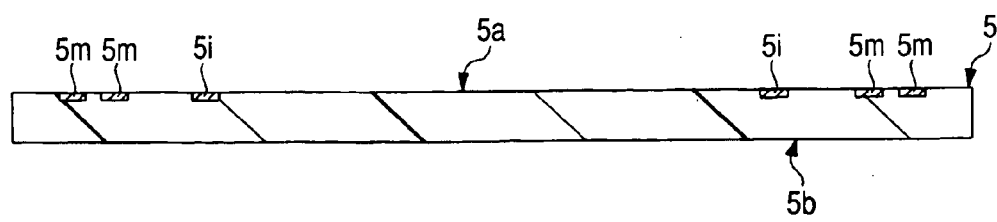
FIG. 11 is a cross sectional view of the wiring board of FIG. 10.
Figure 12:
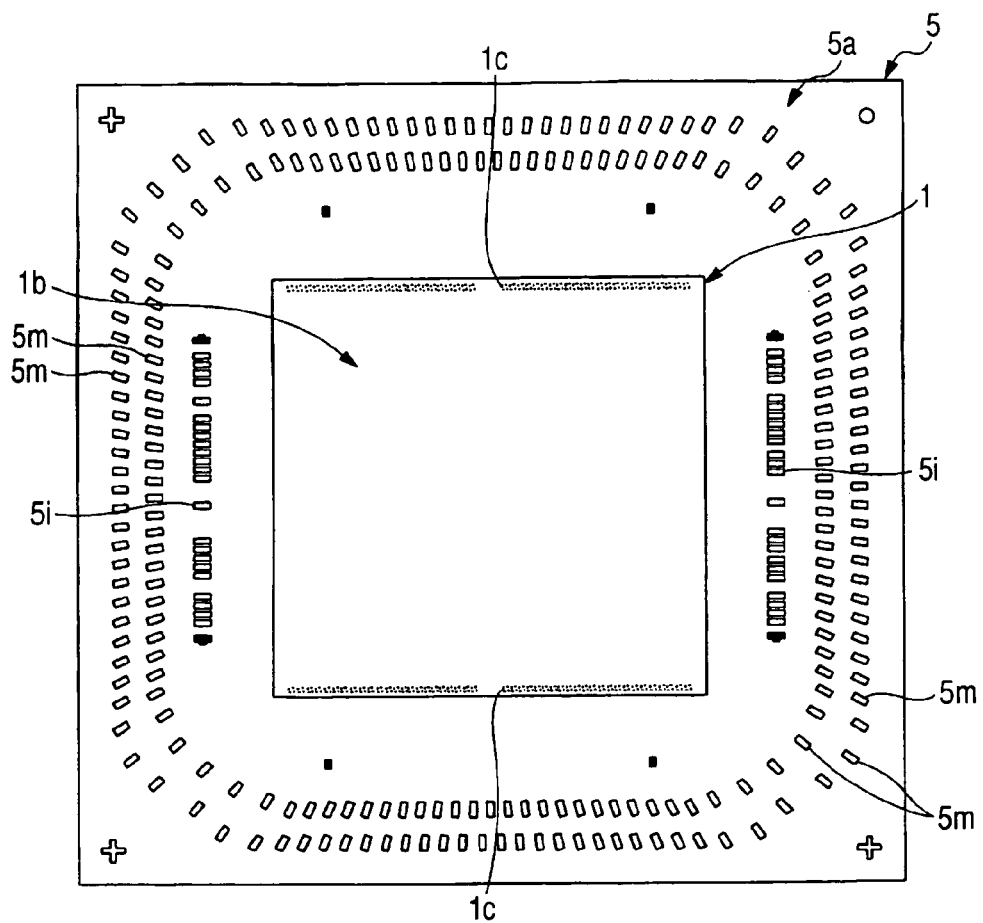
FIG. 12 is a plan view of an example of the structure of the assembly of FIG. 8 at completion of flip-chip connection.
Figure 13:
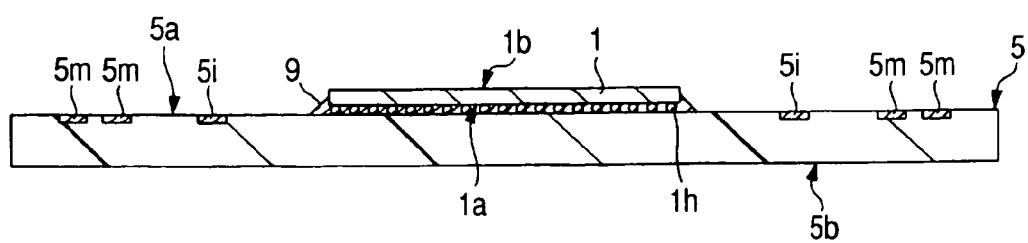
FIG. 13 is a cross sectional view of the structure of FIG. 12 at completion of the flip-chip connection.
Figure 14:
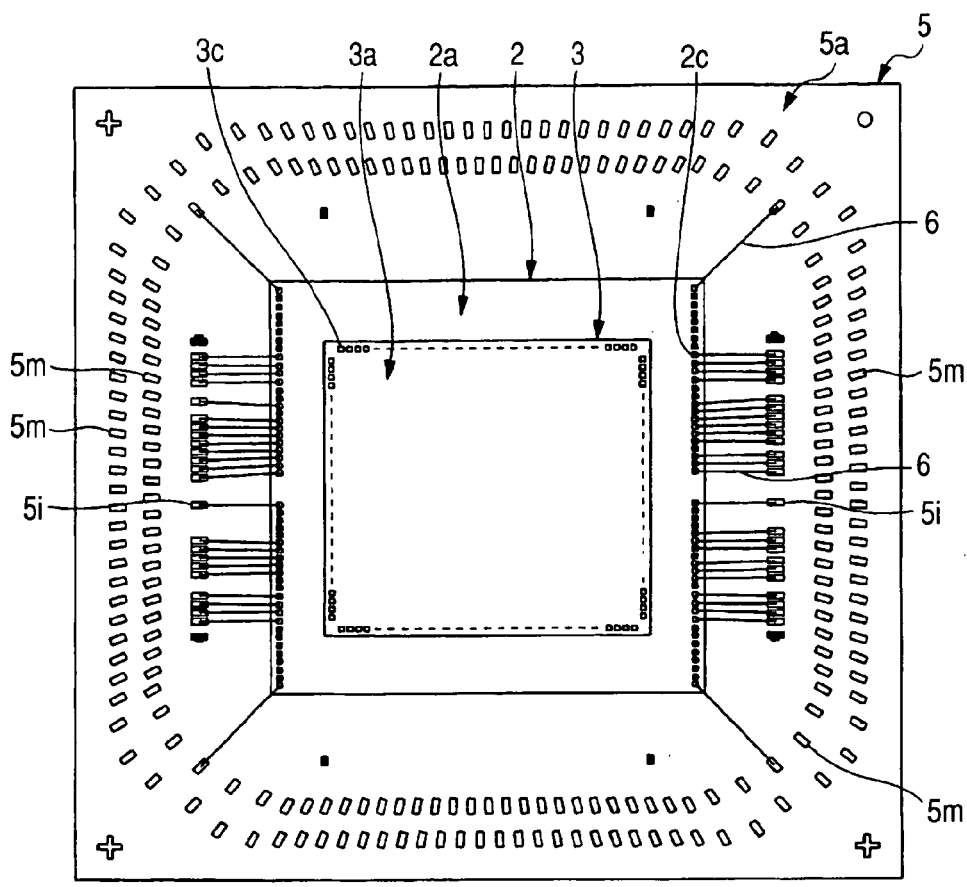
FIG. 14 is a plan view of an example of the structure of the assembly of FIG. 8 at completion of wire-bonding of the second semiconductor chip.
Figure 15:
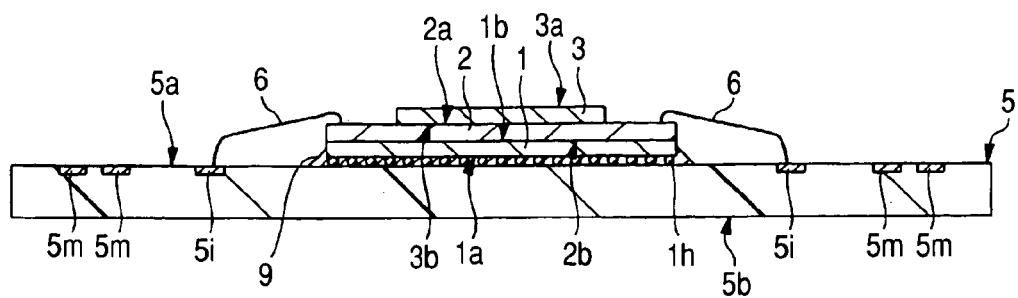
FIG. 15 is a cross sectional view of the structure of FIG. 14 at completion of the wire bonding of the second semiconductor chip.
Figure 16:
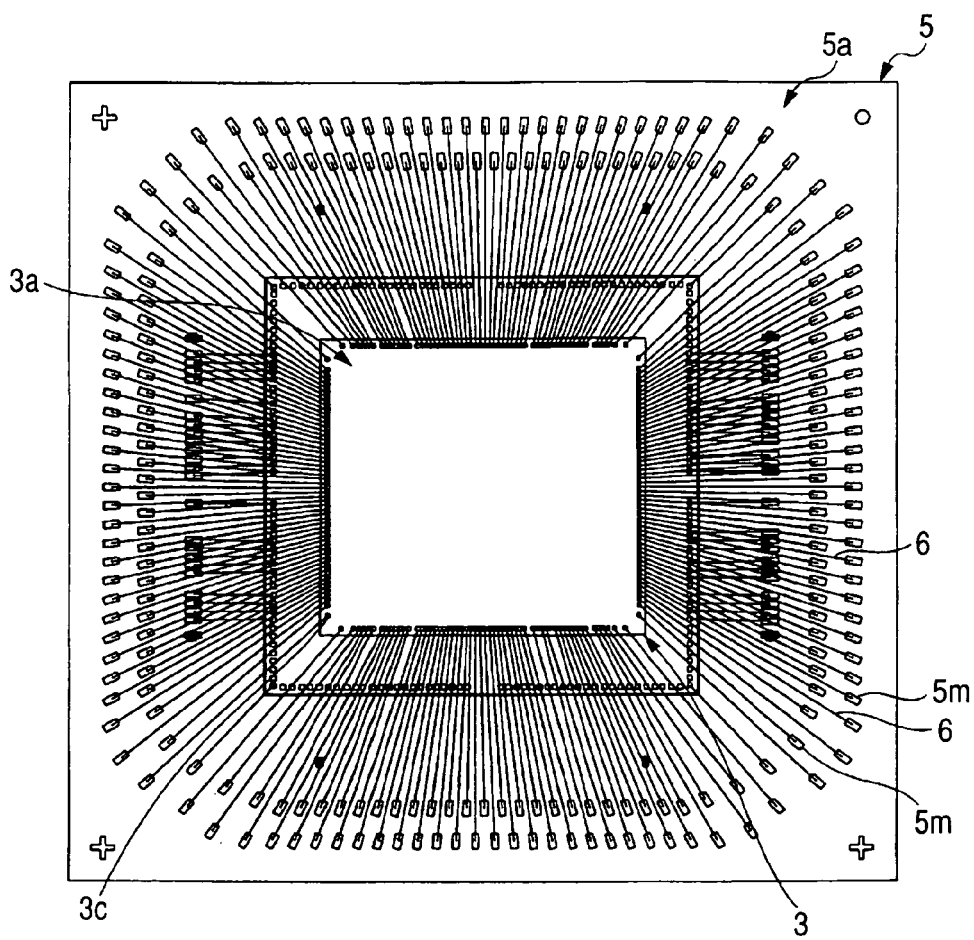
FIG. 16 is a plan view of an example of the structure of the assembly of FIG. 8 at completion of wire bonding of a third semiconductor chip.
Figure 17:
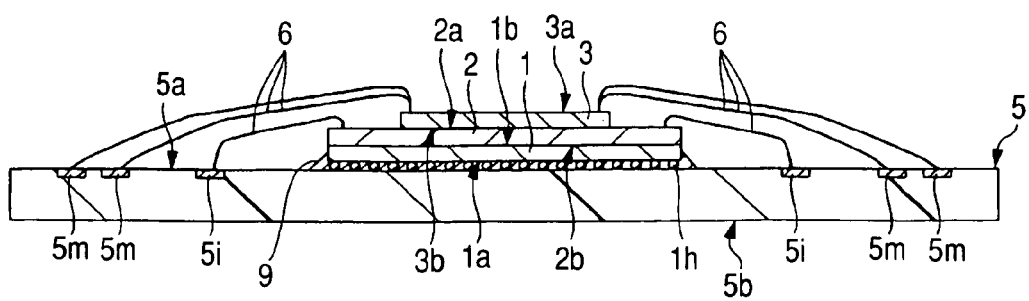
FIG. 17 is a cross sectional view of the structure of FIG. 16 at completion of the wire bonding of the third semiconductor chip.
Figure 18:
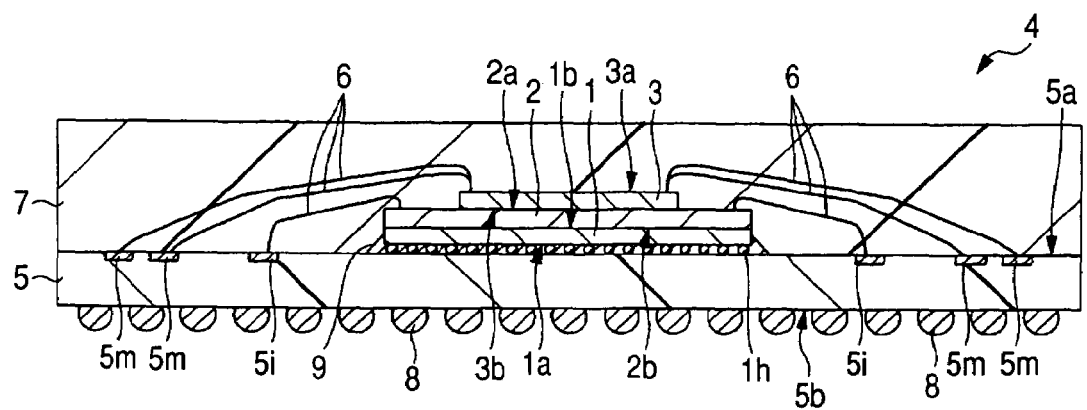
FIG. 18 is a cross sectional view of an example of the structure of the assembly of FIG. 8 at completion of assembly.
Figure 19:
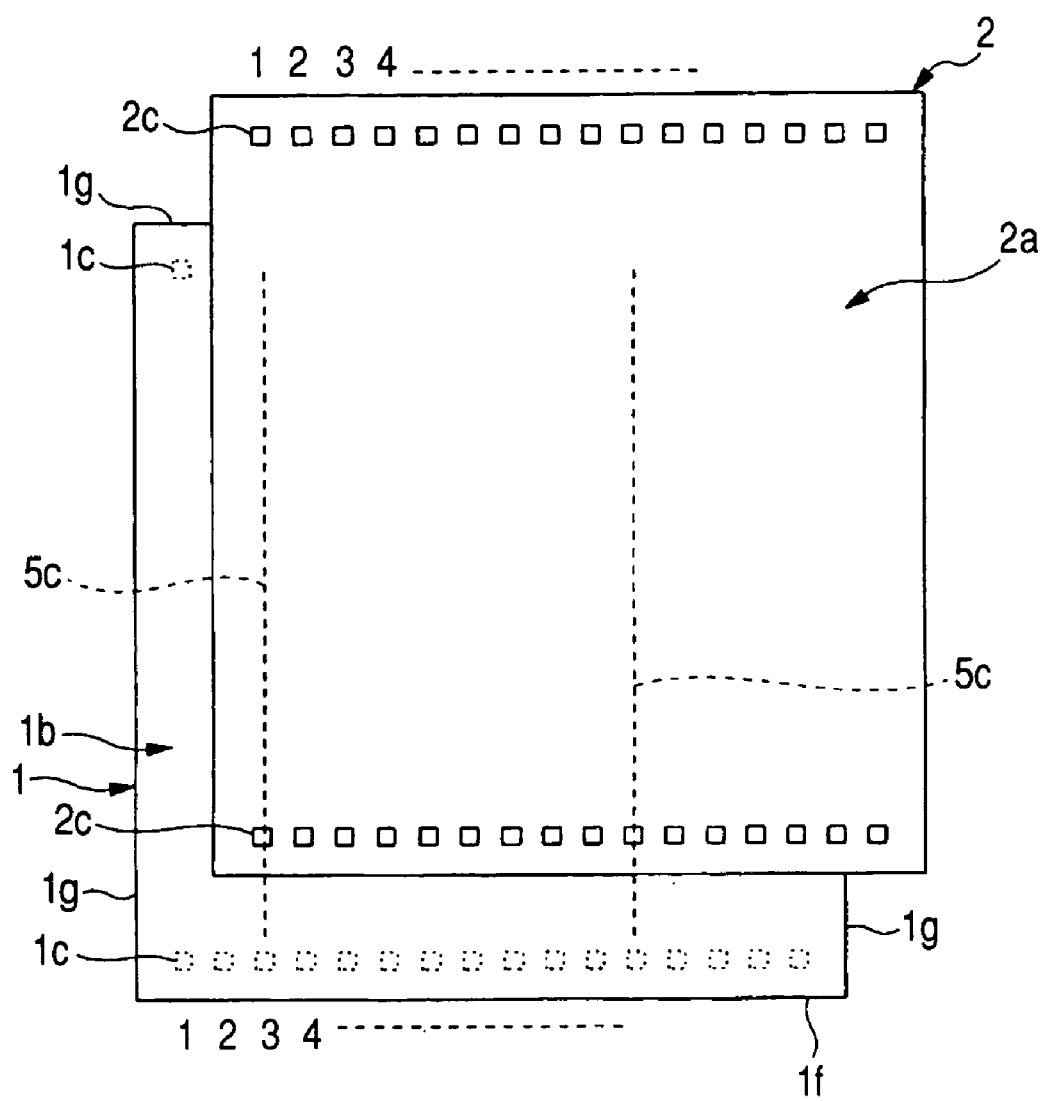
FIG. 19 is a plan view of the mounting direction of a first semiconductor chip and a second semiconductor chip according to a modification of the invention.
Figure 20:
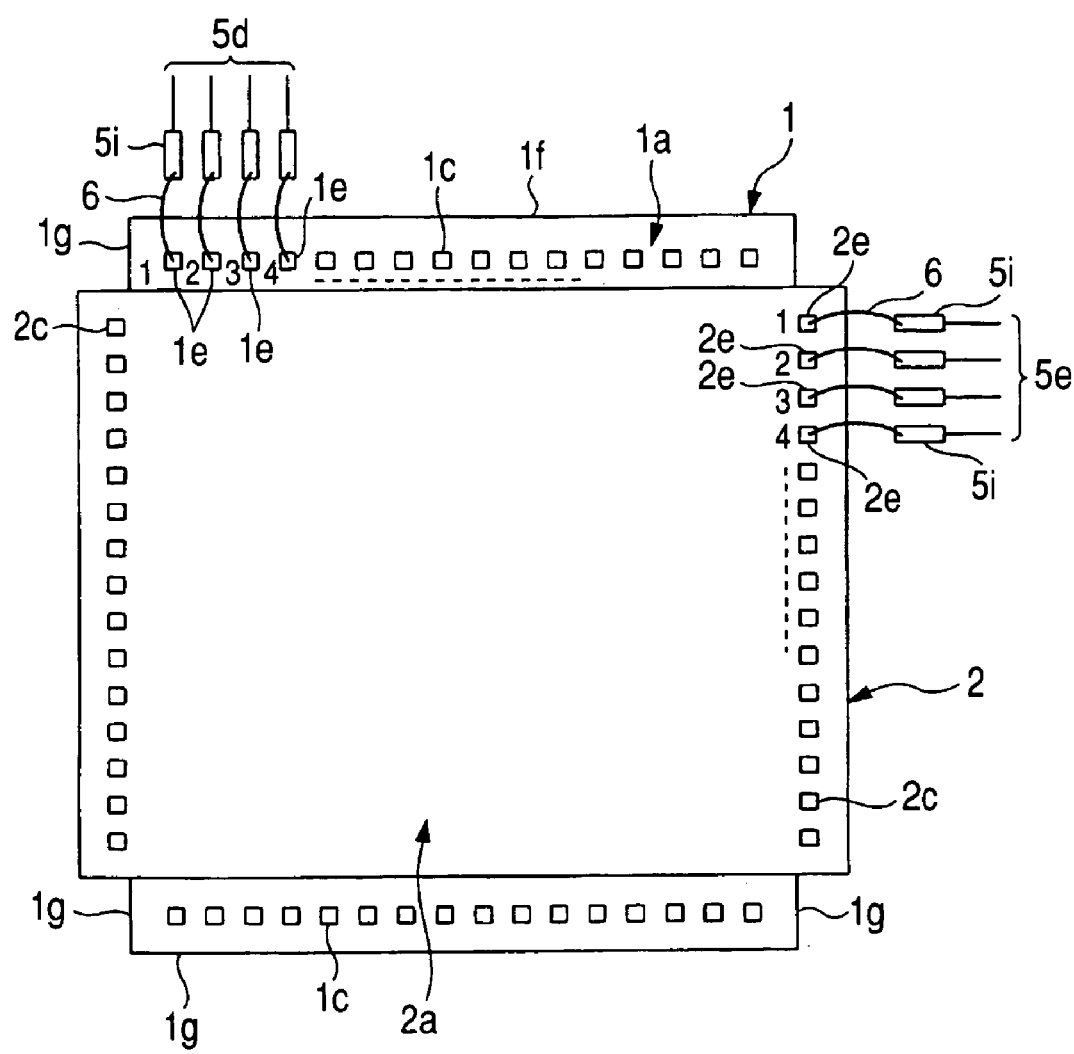
FIG. 20 is a plan view of the mounting state of a first semiconductor chip and a second semiconductor chip according to another modification of the invention.

FIG. 1 is a cross sectional view of an example of the structure of a semiconductor device according to an embodiment of the present invention. FIG. 2 is a block diagram of an example of the semiconductor device of FIG. 1. FIG. 3 is a plan view of an example of the mounting direction of a first semiconductor chip and a second semiconductor chip mounted on the semiconductor device of FIG. 1. FIG. 4 is a plan view of an example of a wiring pattern of the uppermost wire layer (L1) of a wiring board incorporated into the semiconductor device of FIG. 1. FIG. 5 is a plan view of an example of the wiring pattern of the second wire layer (L2) from the top of the wiring board incorporated into the semiconductor device of FIG. 1. FIG. 6 is a plan view of an example of the wiring pattern of the third wire layer (L3) from the top of the wiring board incorporated into the semiconductor device of FIG. 1. FIG. 7 is a plan view of an example of the wiring pattern of the fourth wire layer (L4) from the top of the wiring board incorporated into the semiconductor device of FIG. 1. FIG. 8 is a manufacturing flowchart of an example of the assembly procedure of the semiconductor device of FIG. 1. FIG. 9 is a plan view of an example of the structure of the first semiconductor chip mounted on the semiconductor device of FIG. 1. FIG. 10 is a plan view of an example of the structure of a wiring board incorporated into the semiconductor device of FIG. 1. FIG. 11 is a cross sectional view of the wiring board of FIG. 10. FIG. 12 is a plan view of an example of the structure of the assembly of FIG. 8 at completion of flip-chip connection. FIG. 13 is a cross sectional view of the structure of FIG. 12 at completion of the flip-chip connection. FIG. 14 is a plan view of an example of the structure of the assembly of FIG. 8 at completion of wire bonding of the second semiconductor chip. FIG. 15 is a cross sectional view of the structure of FIG. 14 at completion of the wire bonding of the second semiconductor chip. FIG. 16 is a plan view of an example of the structure of the assembly of FIG. 8 at completion of wire bonding of a third semiconductor chip. FIG. 17 is a cross sectional view of the structure of FIG. 16 at completion of the wire bonding of the third semiconductor chip. FIG. 18 is a cross sectional view of an example of the structure of the assembly of FIG. 8 at completion of assembly. FIG. 19 is a plan view of the mounting direction of a first semiconductor chip and a second semiconductor chip according to a modification of the invention. FIG. 20 is a plan view of the mounting state of a first semiconductor chip and a second semiconductor chip according to another modification of the invention.

The semiconductor device of an embodiment in FIG. 1 is a semiconductor package including multiple semiconductor chips of the same type and a semiconductor chip (central processing unit (CPU)) having the function of controlling the semiconductor chips and an arithmetic processing function. In this embodiment, a system-in-package (SIP) 4 will be described as an example of the semiconductor device, the SIP 4 incorporating two memory chips of the same type (a first semiconductor chip and a second semiconductor chip) and a microcomputer chip (a third semiconductor chip) 3 for controlling the memory chips.

Briefly, the SIP 4 can have a memory of a larger capacity because of including multiple memory chips of the same type and achieve miniaturization of the package body by stacking the multiple semiconductor chips.

The embodiment will be described for a case in which the two memory chips mounted on the SIP 4 are dynamic random access memories (DRAMs) of the same type each having a memory circuit. As shown in FIG. 1, the SIP 4 includes a first DRAM 1 that is a first semiconductor chip disposed face down on a wiring board (package board) 5 and electrically connected to the wiring board 5 by flip-chip connection, on which a second DRAM 2 that is a second semiconductor chip is mounted face up. A microcomputer chip 3 that is a third semiconductor chip is mounted face up on the second DRAM 2.

The second DRAM 2 and the microcomputer chip 3 are thus electrically connected to the wiring board by wire connection.

The first DRAM 1 and the second DRAM 2 have the same size, pad layout, number of pads, and pin function, because of the same type.

A back surface 5b of the wiring board, opposite to the main surface 5a, has multiple ball electrodes 8 serving as external terminals in a matrix layout. The main surface 5a has a sealing medium 7 for sealing the three semiconductor chips and the wires 6 with resin.

In short, the SIP 4 is a semiconductor device of a ball grid array (BGA) type.

The detailed structure of the SIP 4 of FIG. 1 will be described. The SIP 4 is composed of the package board 5 that is a wiring board, the first DRAM 1 that is a first semiconductor chip, the second DRAM 2 serving as a second semiconductor chip, the microcomputer chip 3 that is a third semiconductor chip, the sealing medium 7, and the multiple ball electrodes 8 that are external terminals. The package board 5 has the main surface 5a and the back surface 5b opposite thereto. The first DRAM 1 includes a semiconductor device and multiple pads (electrodes) 1c on the main surface 1a, of which the main surface 1a faces the main surface 5a of the package board 5 and is electrically connected to the package board 5 by flip-chip connection. The second DRAM 2 includes a semiconductor device and multiple pads (electrodes) 2c on the main surface 2a, is mounted on the first DRAM 1 with the main surface 2a up, and is electrically connected to the package board 5 with a conductive wire 6. The microcomputer chip 3 is mounted on the second DRAM 2, has an arithmetic processing function, and is electrically connected to the package board 5 with the conductive wire 6. The sealing medium 7 seals the three semiconductor chips and the multiple wires 6 with resin. The ball electrodes 8 are provided on the back surface 5b of the package board 5.

As shown in FIG. 3, the package board 5 also includes multiple common wires 5c for electrically connecting multiple first electrodes 1d of the pads 1c of the first DRAM 1 and multiple second electrodes 2d of the second DRAM 2, the second electrodes 2d corresponding to the first electrodes 1d, respectively.

The package board 5 also includes multiple first independent wires 5d and multiple second independent wires 5e. The first independent wires 5d are connected to multiple third electrodes 1e that are not connected to the common wires 5c of the pads 1c of the first DRAM 1, and are electrically connected to the corresponding ball electrodes 8. The second independent wires 5e are connected to multiple fourth electrodes 4e that are not connected to the common wires 5c of the pads 2c of the second DRAM 2, and are electrically connected to the corresponding ball electrodes 8.

The first DRAM 1 has a first side if along the row of the first electrodes 1d connected to the common wires 5c and the other sides 1g. The second DRAM 2 is mounted on the first DRAM 1 such that the second electrodes 2d connected to the common wires 5c are arranged along the other sides 1g of the first DRAM 1.

The common wires 5c, the first independent wires 5d, and the second independent wires 5e are electrically connected to corresponding pads (electrodes) 3c of the microcomputer chip 3, shown in FIG. 14.

Referring to FIG. 2, an example of the system configuration of the SIP 4 of the embodiment will be described. The microcomputer chip 3 and the first DRAM 1 are connected together for each electrode with the common wires 5c and the first independent wires 5d. The microcomputer chip 3 and the second DRAM 2 are connected together for each electrode with the common wires 5c and the second independent wires 5e. Those connected with the common wires 5c are electrodes for command signals, such as CS, CLK, CKE, RAS, CAS, WE, DQM, and BA, and electrodes for address signals. Accordingly, there are provided the multiple common wires 5c.

Those connected with the first independent wires 5d are electrodes for data signals between the microcomputer chip 3 and the first DRAM 1. Those connected with the second independent wires 5e are electrodes for data signals between the microcomputer chip 3 and the second DRAM 2. There are provided multiple first independent wires 5d and second independent wires 5e.

In other words, the SIP 4 has a wiring structure in which data buses are divided such that independent wires for data signals are provided separately between the microcomputer chip 3 and the two memory chips, respectively. In that case, the address signals are inputted to the first DRAM 1 and the second DRAM 2 via the common wires 5c. Accordingly, when data read signals are inputted to the respective addresses of the first DRAM 1 and the second DRAM 2, the first DRAM 1 and the second DRAM 2 output data to the corresponding electrodes of the microcomputer chip 3 simultaneously.

Data lines DQ0 to DQ7 assigned by the first DRAM 1 and data lines DQ8 to DQ15 assigned by the second DRAM 2 can exchange data independently with the microcomputer chip 3. In short, the SIP 4 can operate two memory chips in parallel. This reduces loads on memory chips during data transfer.

Thus, the SIP 4 can achieve speed-up of data transfer.

The SIP 4 includes two memory chips of the same type (the first DRAM 1 and the second DRAM 2), thus allowing mass storage of the memory. Also, the SIP 4 can mount mass-storage memory chips without changing pin arrangement in replacement to higher-capacity chips.

The characteristics of the SIP 4, for achieving miniaturization of the structure of the system in FIG. 2 will then be described.

The first DRAM 1 and the second DRAM 2 mounted on the SIP 4, which are two memory chips of the same type, have the pads 1c and 2c on the opposite sides of the main surface 1a and 2a, respectively (refer to FIG. 3). The first DRAM 1 electrically connects to the package board 5 by flip-chip connection via a gold bump 1h, so that a flip-chip electrode group 5j can be disposed in the chip region of the first DRAM 1, as shown in FIG. 4.

The second DRAM 2 is mounted face up on the back surface 1b of the first DRAM 1, with the main surface 2a up. The back surface 1b of the first DRAM 1 and the back surface 2b of the second DRAM 2 are joined together with an adhesive etc., and the second DRAM 2 is electrically connected to the package board 5 by wire connection because of face-up connection.

As shown in FIG. 3, the second DRAM 2 is mounted on the first DRAM 1 such that multiple second electrodes 2d are arranged along the other sides 1g of the first DRAM 1. For example, as shown in FIG. 3, the second DRAM 2 is disposed such that the orientation of the arrangement of the pads 2c forms an angle 90° from the first DRAM 1. Specifically speaking, the second DRAM 2 is mounted face up on the first DRAM 1 disposed face down such that the orientation of the arrangement of the pads 2c is at an angle 90° relative to the orientation of the arrangement of the pads 1c of the first DRAM 1.

Thus, the second DRAM 2 of the same type as the first DRAM 1 is mounted on the first DRAM 1 in a different direction, so that the common wires 5c can be routed on the package board 5 without crossing, as shown in FIG. 3.

As a result, the common wires 5c can be routed without an increase in number of the wiring layers of the package board 5, thus achieving low profile of the package board 5 and cost reduction.

Also, the second DRAM 2 of the same type as the first DRAM 1 is mounted on the first DRAM 1 in a different direction, so that multiple flip-chip electrodes 5f and multiple wire-connection electrodes 5i can be dispersed in different regions on the surface of the package board 5, as shown in FIG. 4, thus allowing efficient arrangement of electrodes and wires on the surface of the package board 5.

Consequently, the package board 5 can be made more compact, thus achieving both of mass storage and miniaturization of the SIP 4.

The package board 5 is a multilayer wiring board having multiple wiring layers composed of, e.g., a resin substrate, multiple wires made of a copper alloy etc., electrodes, and an insulator film for insulating surface wires.

The wires 6 in FIG. 1 are made of, e.g., gold. The ball electrodes 8 are made of solder. The flip-chip connection of the first DRAM 1 is protected by an under-filling sealing portion 9 made of isolative resin etc. The sealing medium 7 for covering the wires 6 and three semiconductor chips on the main surface 5a of the package board 5 are made of, e.g., thermosetting epoxy resin.

Examples of the respective wiring patterns of the wire layers of the package board 5 of the SIP 4 in which a larger-capacity memory and a smaller package body are achieved will now be described. FIGS. 4, 5, 6, and 7 show the wiring patterns of the wire layers of the main surface 5a of the package board 5, the uppermost wire layer (L1), the second wire layer (L2) from the top, the third wire layer (L3) from the top, and the fourth wire layer (L4) from the top, respectively.

The uppermost wire layer (L1) of FIG. 4 includes two facing multiple flip-chip electrodes 5f for flip-chip connection with the first DRAM 1 and a wire-connection electrode group 5k in which two facing wire-connection electrodes 5i for wire connection with the second DRAM 2 are disposed at an angle 90° relative to the orientation of the flip-chip electrode group 5j.

Accordingly, the facing two flip-chip electrode groups 5j and the facing two wire-connection electrode groups 5k disposed at an angle 90° therefrom form a rough rectangle. Around almost the entire periphery of the flip-chip electrode groups 5j and the wire-connection electrode groups 5k, microcomputer wire-connection electrodes 5m for wire-bonding to the microcomputer chip 3 are provided in two rounds.

The wire layers each have the common wires 5c for connecting the flip-chip electrodes 5f for the first DRAM 1 to the wire-connection electrodes 5i for the second DRAM 2, the first independent wires 5d for connecting to the flip-chip electrodes 5f for the first DRAM 1, and the second independent wires 5e for connecting to the wire-connection electrodes 5i for the second DRAM 2.

Here an example of the routing of the common wires 5*c*, the first independent wires 5*d*, and the second independent wires 5*e* of each wire layer of the package board 5 will be described.

As shown in FIG. 4, the two common wires 5*c* (e.g., for CAS and for RAS) connected to the flip-chip electrodes 5*f* for the first DRAM 1 are routed inside the flip-chip electrode groups 5*j* and then connected to the wire-connection electrodes 5*i* for the second DRAM 2 of the same type. Also the two common wires 5*c* (A18 and A21) for addressing are also routed inside the flip-chip electrode groups 5*j* and then connected to the wire-connection electrodes 5*i* for the second DRAM 2 of the same type.

The common wires 5*c* for CAS and RAS further connect to the microcomputer wire-connection electrodes 5*m* of the uppermost wire layer (L1) through through-hole wires 5*g* via the common wires 5*c* of the second wire layer (L2) shown in FIG. 5. The two common wires 5*c* for addressing are routed on the uppermost wire layer (L1) and then connect to the microcomputer wire-connection electrodes 5*m*, so that they can connect to the corresponding pads 3*c* of the microcomputer chip 3.

The two first independent wires 5*d* (e.g., data lines D13 and D15) that connect to the flip-chip electrodes 5*f* for the first DRAM 1 and the two second independent wires 5*e* (e.g., data lines D4 and D5) that connect to the wire-connection electrodes 5*i* for the second DRAM 2, shown in FIG. 4, connect to the microcomputer wire-connection electrodes 5*m* of the uppermost wire layer (L1) through the through-hole wires 5*g* and the wires of the second wire layer (L2) of FIG. 5, so that they can connect to the corresponding pads 3*c* of the microcomputer chip 3.

The common wires 5*c*, the first independent wires 5*d*, and the second independent wires 5*e* pass through the respective through-hole wires 5*g* of the second wire layer (L2) of FIG. 5 and the third wire layer (L3) of FIG. 6 to connect to the lower-layer wires, and then connect to the corresponding bump lands 5*h* through the through-hole wires 5*g* of the fourth wire layer (L4) shown in FIG. 7.

Consequently, the common wires 5*c*, the first independent wires 5*d*, and the second independent wires 5*e* are connected to the corresponding pads 3*c* of the microcomputer chip 3 and the ball electrodes 8 that are external terminals.

In the package board 5 incorporated in the SIP 4 of this embodiment, the flip-chip connection and the wire-bonding connection are combined, and the second DRAM 2 of wire-bonding connection are mounted on the first DRAM 1 of flip-chip connection such that the orientation of the arrangement of the pads forms an angle 90° from each other. Thus, the flip-chip electrodes 5*f* and the wire-connection electrodes 5*i* can be dispersed in the regions at an angle 90° from each other. Thus the common wires 5*c* for connecting the first DRAM 1 and the second DRAM 2 can be routed without crossing on the surface wire layer of the package board 5, thereby reducing the number of wire layers of the package board 5 and the size of the package board 5.

The reduction of the number of the wire layers leads to the low profile of the package board 5 and reduction in cost.

The assembly of the SIP 4 of this embodiment will then be described with reference to the flowchart of FIG. 8.

In step S1 of FIG. 8, a board is first prepared. Here the package board 5 shown in FIGS. 10 and 11, which includes the wire layers of FIGS. 4 to 7, is prepared. On the main surface 5*a* of the package board 5, the multiple flip-chip electrodes 5*f* corresponding to the pads 1*c* of the first DRAM 1, the multiple wire-connection electrodes 5*i* corresponding to the pads 2*c* of the second DRAM 2, and the multiple microcomputer wire-connection electrodes 5*m* corresponding to the pads 3*c* of the microcomputer chip 3 are provided.

The first DRAM 1 that is the first semiconductor chip of FIG. 9 in which each pad 1*c* has the gold bump 1*h* is prepared. In other words, the first DRAM 1 is a memory chip including a memory circuit.

Then flip-chip connection of the first DRAM 1 is performed in step S2. At that time, a paste adhesive is first applied on the main surface 5*a* of the package board 5, on which the first DRAM 1 of FIG. 9 is disposed face down. Thereafter, as shown in FIGS. 12 and 13, the first DRAM 1 is flip-chip connected to the package board 5 by thermocompression bonding.

Accordingly, the pads 1*c* of the first DRAM 1 are electrically connected to the corresponding flip-chip electrodes 5*f* of the package board 5 via the gold bumps 1*h* and the adhesive is cured to form the under-filling sealing portion 9 for protecting the flip-chip connecting portions.

Thereafter, second-DRAM die bonding is performed in step S3. The second DRAM 2 of the same type as the first DRAM 1 is mounted face up on the back surface 1*b* of the first DRAM 1 and then the back surface 1*b* of the first DRAM 1 and the back surface 2*b* of the second DRAM 2 are connected with each other with an adhesive etc.

At that time, the second DRAM 2 is mounted on the first DRAM 1 such that the orientation of the arrangement of the pads forms an angle 90° from that of the first DRAM 1.

Then, in step S4, microcomputer-chip die bonding is performed. Here the microcomputer chip 3 that is a third semiconductor chip, which can control the first DRAM 1 and the second DRAM 2 and has an arithmetic processing function, is mounted face up on the main surface 2*a* of the second DRAM 2 with the main surface 3*a* up, and then the main surface 2*a* of the second DRAM 2 and the back surface 3*b* of the microcomputer chip 3 are bonded to each other with an adhesive etc, as shown in FIG. 15.

In step S5, second-DRAM wire bonding is performed. Specifically, as shown in FIGS. 14 and 15, the pads 2*c* of the second DRAM 2 and the corresponding wire-connection electrodes 5*i* of the package board 5 are electrically connected with the wires 6 made of gold etc.

Subsequently, in step S6, microcomputer-chip wire bonding is performed. Specifically, as shown in FIGS. 16 and 17, the pads 3*c* of the microcomputer chip 3 and the corresponding microcomputer wire-connection electrodes 5*m* of the package board 5 are electrically connected with the wires 6 made of gold etc.

Then, in step S7, plastic molding is performed. For example, thermosetting epoxy resin etc. is applied onto the main surface 5*a* of the package board 5 to form the sealing medium 7 shown in FIG. 18, thereby sealing the three semiconductor chips and the wires 6 with the sealing medium 7.

Then, in step S8, ball-electrode connection is performed. The ball electrodes 8 made of solder etc. are electrically connected to the bump lands 5*h* on the back surface 5*b* of the package board 5 by reflow soldering.

Thus the assembly of the SIP 4 is completed.

When multiple SIPs 4 are formed collectively using a multiple-production board, the board is cut into pieces after ball-electrode connection processing, and then the assembly is completed.

A semiconductor device according to a modification of the invention will be described.

FIG. 19 shows a modification in which the second DRAM 2 of the same type as the first DRAM 1 is mounted face up on the face-down first DRAM 1 such that the orientation of the arrangement of the pads forms an angle 180° from that of the first DRAM 1.

This case requires a micro wire-fabrication technique, because the common wires 5c must be passed between adjacent flip-chip electrodes S*f* when the common wires 5c are routed on the surface wire layer of the package board 5. However, the multiple common wires 5c can be routed on the surface wire layer without crossing, thus providing the similar advantages as the case in which the pad arrangements are at 90° from each other.

FIG. 20 shows a modification in which when two semiconductor chips of the same type are mounted, the semiconductor chips connect to individual multiple data lines, or the first independent wires 5d and the second independent wires 5e, by dividing a data line (data-bus division). In this case, the second DRAM 2 of the same type as the first DRAM 1 is mounted face up on the face-up first DRAM 1. At that time, the second DRAM 2 is mounted on the first DRAM 1 such that the orientation of the arrangement of the pads of the second DRAM 2 forms an angle 90° from that of the first DRAM 1. Since both chips are mounted face up, the chips are connected to the package board 5 by wire connection.

In this case, the orientation of the arrangement of the pads of the second DRAM 2 forms an angle 90° from that of the first DRAM 1. Accordingly, the wire-connection electrodes 5i to be connected to the chips via the wires 6 can be dispersed in the region at 90° from each other. This facilitates forming the space for routing the wires and so facilitates wiring layout.

Accordingly, the first independent wires 5d to be connected to the pads 1c (the third electrodes 1e) of the first DRAM 1 via the wires 6 can be disposed outside the wire-connection electrodes 5i, and also the second independent wires 5e to be connected to the pads 2c (the fourth electrodes 2e) of the second DRAM 2 via the wires 6 can be disposed outside the wire-connection electrodes 5i and as such, the first independent wires 5d and the second independent wires 5e can easily be routed.

The present invention by the inventor has been specifically described with reference to the foregoing embodiment. It is to be understood that the invention is not limited to the embodiment of the invention but may be modified in various forms without departing from the spirit and scope thereof.

For example, although the embodiment includes two semiconductor chips of the same type as DRAM, the semiconductor device may include any number more than one semiconductor chips of the same type.

Although the semiconductor device according to the embodiment includes the ball electrodes 8 as external terminal, the semiconductor device may have an external terminal other than the ball electrodes 8, if only including a wiring board and at least two semiconductor chips mounted thereon, such as a land grid array (LGA) type.

The present invention is suitable for electronic devices and semiconductor devices.

What is claimed is:

1. A semiconductor device comprising:
   a wiring board having a main surface and a back surface opposite to the main surface, the main surface having a substantially rectangular planar shape including a pair of opposite first sides and a pair of opposite second sides, the main surface having a plurality of flip-chip electrodes disposed along at least one of the pair of first sides, a plurality of wire-connection electrodes disposed along at least one of the pair of second sides, and a plurality of common wiring patterns electrically connecting the plurality of flip-chip electrodes and the plurality of wire-connection electrodes, respectively;
   a first semiconductor chip having a first chip main surface and a first chip back surface opposite to the first chip main surface, the first chip main surface having a substantially rectangular planar shape including a pair of opposite first chip sides and a pair of opposite second chip sides, the first chip main surface having a plurality of first pads disposed along at least one of the pair of first chip sides and not disposed along the pair of second chip sides, wherein the first semiconductor chip is mounted over the main surface of the wiring board such that the first chip main surface faces the main surface of the wiring board, and the first chip sides are parallel with the first sides of the wiring board;
   a second semiconductor chip having a second chip main surface and a second chip back surface opposite to the second chip main surface, the second chip main surface having a substantially rectangular planar shape including a pair of opposite third chip sides and a pair of opposite fourth chip sides, the second chip main surface having a plurality of second pads disposed along at least one of the pair of third chip sides and not disposed along the pair of fourth chip sides, wherein the second semiconductor chip is the same type as the first semiconductor chip, wherein the second semiconductor chip is mounted over the first semiconductor chip such that the second chip back surface faces the first chip back surface of the first semiconductor chip, and the third chip sides are parallel to the second sides of the wiring board;
   a plurality of bumps, each bump electrically connecting one of the plurality of first pads of the first semiconductor chip and a respective one of the plurality of flip-chip electrodes of the wiring board;
   a plurality of wires, each wire electrically connecting one of the plurality of second pads of the second semiconductor chip and a respective one of the plurality of wire-connection electrodes of the wiring board;
   a sealing body sealing the first semiconductor chip, the second semiconductor chip and the plurality of wires; and
   a plurality of external terminals disposed on the back surface of the wiring board.

2. The semiconductor device according to claim 1, wherein the first semiconductor chip and the second semiconductor chip have a same overall size.

3. The semiconductor device according to claim 1, wherein the first semiconductor chip and the second semiconductor chip each have a memory circuit.

4. The semiconductor device according to claim 1, wherein a third semiconductor chip, which has a third chip main surface having a substantially rectangular planar shape and a plurality of third pads disposed along sides thereof, and a third chip back surface opposite to the third chip main surface, is mounted over the second chip main surface of the second semiconductor chip.

5. The semiconductor device according to claim 4, wherein an overall size of the third semiconductor chip is smaller than that of the first semiconductor chip and the second semiconductor chip.

6. The semiconductor device according to claim 4, wherein the third semiconductor chip has a microprocessor.

7. The semiconductor device according to claim 4, wherein the plurality of third pads of the third semiconductor chip are electrically connected with a plurality of third semiconductor chip wire-connection electrodes disposed along the pair of first sides and the pair of second sides of the wiring board.

8. The semiconductor device according to claim 7, wherein the plurality of third semiconductor chip wire-connection electrodes of the wiring board includes electrodes arranged toward the first sides of the wiring board from the plurality of flip-chip electrodes and arranged toward the second sides of the wiring board from the plurality of wire-connection electrodes.

9. The semiconductor device according to claim 7, wherein at least one third semiconductor chip wire-connection electrode is electrically connected with a respective flip-chip electrode and a respective wire connection electrode through a respective common wiring pattern.

10. The semiconductor device according to claim 4, wherein each of the main surface of the wiring board, the first chip main surface of the first semiconductor chip, the second chip main surface of the second semiconductor chip, and the third chip main surface of the third semiconductor chip has a substantially square planar shape.

11. The semiconductor device according to claim 1, wherein each of the main surface of the wiring board, the first chip main surface of the first semiconductor chip, and the second chip main surface of the second semiconductor chip has a substantially square planar shape 12. The semiconductor device according to claim 1, wherein the plurality of second pads of the second semiconductor chip are arranged in the same order as the plurality of first pads of the first semiconductor chip.

* * * * *